United States Patent [19]

Hornung

[11] Patent Number: 4,945,760
[45] Date of Patent: Aug. 7, 1990

[54] COMBINED MOTOR TESTER AND PULSE TRAIN MONITOR FOR STEPPER MOTORS

[76] Inventor: Thomas F. Hornung, 144 Wimbleton Dr., Birmingham, Mich. 48009

[21] Appl. No.: 423,804

[22] Filed: Oct. 18, 1989

[51] Int. Cl.$^5$ .......................................... G01M 19/00
[52] U.S. Cl. .................................. 73/118.1; 324/542; 324/133
[58] Field of Search .................. 73/116, 118.1, 119 A; 371/15.1, 17, 25.1; 324/133, 542, 556

[56] References Cited

U.S. PATENT DOCUMENTS

| 4,407,433 | 10/1983 | Schroeder | 222/415 |
| 4,550,287 | 10/1985 | Babcock | 324/542 |
| 4,756,186 | 7/1988 | Sangawa | 73/119 A |
| 4,764,727 | 8/1988 | McConchie, Sr. | 324/542 |
| 4,862,371 | 8/1989 | Maekawa | 73/117.2 |

FOREIGN PATENT DOCUMENTS

| 8707730 | 12/1987 | World Int. Prop. O. | 324/542 |
| 8803653 | 5/1988 | World Int. Prop. O. | 324/133 |
| 8901633 | 2/1989 | World Int. Prop. O. | 324/133 |

Primary Examiner—Robert Raevis
Attorney, Agent, or Firm—Reising, Ethington, Barnard, Perry & Milton

[57] ABSTRACT

A combined stepper motor tester and pulse train monitor is disclosed for use with a vehicle engine idle air control system. The motor tester comprises a driver pulse generator for generating a pair of pulse trains for energizing the two coils of a stepper motor. It is provided with a manually actuated switch for controlling the phase sequence and time duration of the pulse trains applied to the motor. The operation of the motor by the motor tester, with the vehicle engine running, causes the engine computer module to generate a pair of pulse trains in response to the changing engine conditions. A pulse train monitor, plugged into the output of the engine control module includes a pair of bi-polar LEDs, one for each of the pulse trains generated by the engine control module. The bi-polar LED for each pulse train will alternately flash without both LEDs being off at the same time in response to an uninterrupted pulse train.

7 Claims, 4 Drawing Sheets

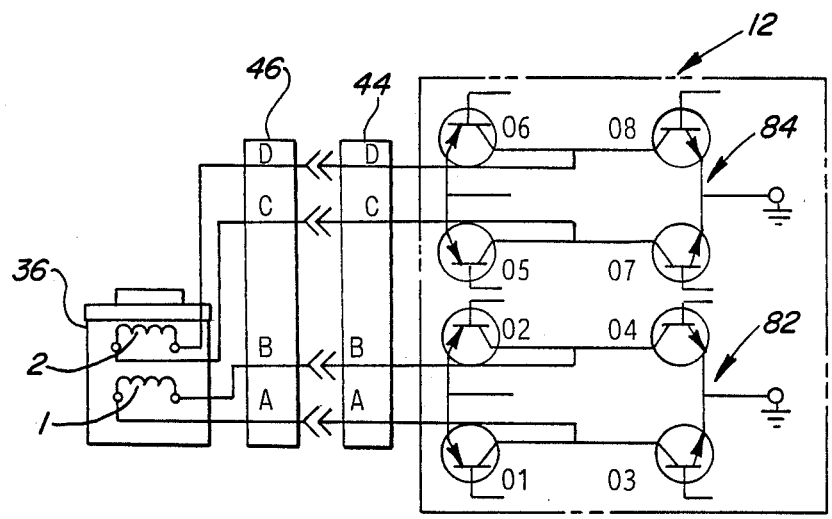
Fig-2
*PRIOR ART*
| STEP | 01-04 | 02-03 | 05-08 | 06-07 |
|------|-------|-------|-------|-------|
| 1 | ON | OFF | ON | OFF |
| 2 | ON | OFF | OFF | ON |
| 3 | OFF | ON | OFF | ON |
| 4 | OFF | ON | ON | OFF |
| 5 | ON | OFF | ON | OFF |
*Fig-3*
*PRIOR ART*
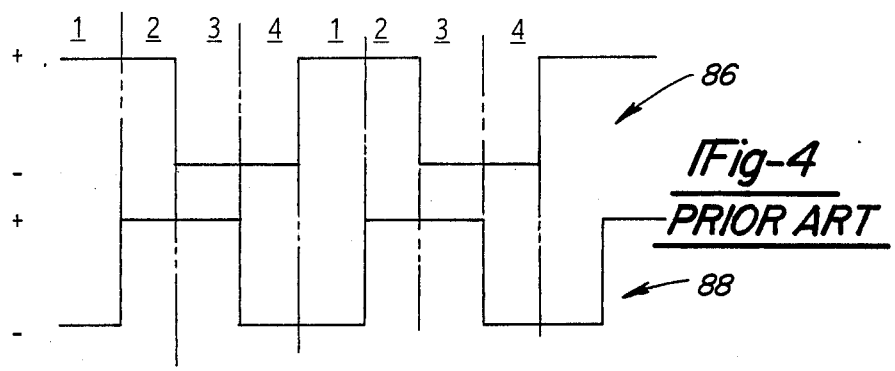
*Fig-4*
*PRIOR ART*

COMBINED MOTOR TESTER AND PULSE TRAIN MONITOR FOR STEPPER MOTORS

FIELD OF THE INVENTION

This invention relates to idle air control systems for vehicle engines using a stepper motor controlled by the engine computer module. More particularly, it relates to a combined tester and monitor for the engine idle air control system.

BACKGROUND OF THE INVENTION

In vehicle engines of current design, the carburetion or fuel injection system is provided with an idle air control system controlled by the vehicle engine control module (ECM). Typically, this comprises a fuel injection system of the throttle body injection type with an idle air inlet at the venturi adjacent the throttle valve. The volume of idle air inlet is controlled by an idle air valve which is actuated by a stepper motor. The engine idle speed is controlled by the ECM in response to various engine parameters by the controlled energization of the stepper motor. A driver circuit in the ECM produces first and second out-of-phase, sequence-controlled pulse trains for energizing the respective coils of the stepper motor for direction and displacement control thereof. The pulse trains, for example, have a constant frequency of sixteen pulses per second and the motor is rotated a fixed increment in response to each sequence step in the pulse trains with the direction of rotation being dependent upon the phase sequence of the pulse trains. The ECM controls the number of steps in order to obtain a desired setting of the idle air inlet valve.

Testers are already known for testing the stepper motor of an idle air control system in a vehicle engine without removing the motor. Such a tester comprises, in general, a driver pulse generator for generating the pair of pulse trains for respective stepper motor coils and a manually actuated switch for controlling the phase sequence and time duration of the pulse trains. The tester allows for testing of the motor for correct functioning and response to commands for correct idle speed.

In addition to testing the stepper motor for proper operation, it is desired to monitor the pulse trains from the driver circuits to ensure that they are uninterrupted throughout the duration of an ECM commanded idle air adjustment.

A general object of this invention is to provide an improved idle air control system tester with a monitor for stepper motor pulse trains and to overcome certain disadvantages of the prior art.

SUMMARY OF THE INVENTION

In accordance with this invention, a pulse train monitor is combined with a stepper motor tester to permit testing of the pulse trains generated by the engine computer module simultaneously with the testing of the stepper motor operation by a manually controlled driver pulse generator with the vehicle engine running. This is accomplished by disconnecting the ECM harness connector from the motor and connecting it with the monitor for display of the pulse trains on a pair of bi-polar LEDs. The motor tester is connected to the motor and supplies energizing pulse trains to drive the motor and thus vary the pulse trains from the ECM to the monitor.

Further, in accordance with this invention, a monitor is provided for monitoring first and second out-of-phase voltage pulse trains for energizing a stepper motor. The monitor comprises a first monitor circuit having first and second terminals with a first pair of LEDs connected in parallel therebetween with opposite polarity, said first and second terminals being adapted to receive the first pulse train voltage thereacross, and a second monitor circuit having third and fourth terminals with a second pair of LEDs connected in parallel therebetween with opposite polarity, said third and fourth terminals being adapted to receive the second pulse train voltage thereacross, whereby each pair of LEDs will alternately flash without both LEDs being off at the same time in response to an uninterrupted pulse train.

Further, in accordance with this invention, a tester is provided for a vehicle engine idle air control system including a motor tester and a pulse train monitor. The motor tester is of the type comprising a driver pulse generator for generating out-of-phase pulse trains and a manually actuated switch for controlling the phase sequence and time duration of the pulse trains. The tester is provided with a wiring harness including a disconnectible connector adapted to be connected with the connector of the stepper motor to be tested when the wiring harness connector from the ECM is disconnected from said motor connector. The pulse trains from the driver pulse generator are applied under manual control to the stepper motor. The pulse train monitor comprises a first circuit with a first pair of LEDs connected in parallel with opposite polarity and a second circuit with a second pair of LEDs connected in parallel with opposite polarity. The monitor is provided with a connector which receives the harness connector from the ECM for monitoring the pulse trains produced by the ECM in response to the energization of the stepper motor under manual control.

A complete understanding of this invention may be obtained from the detailed description that follows taken with the accompanying drawings.

DECRIPTION OF THE DRAWINGS

FIG. 2 is a schematic diagram of the driver circuit for the stepper motor coils;

FIG. 3 is a table showing the switching sequence for the driver circuit of FIG. 3;

FIG. 4 is a waveform diagram of the pulse trains for the stepper motor;

BEST MODE FOR CARRYING OUT THE INVENTION

Figure 1:
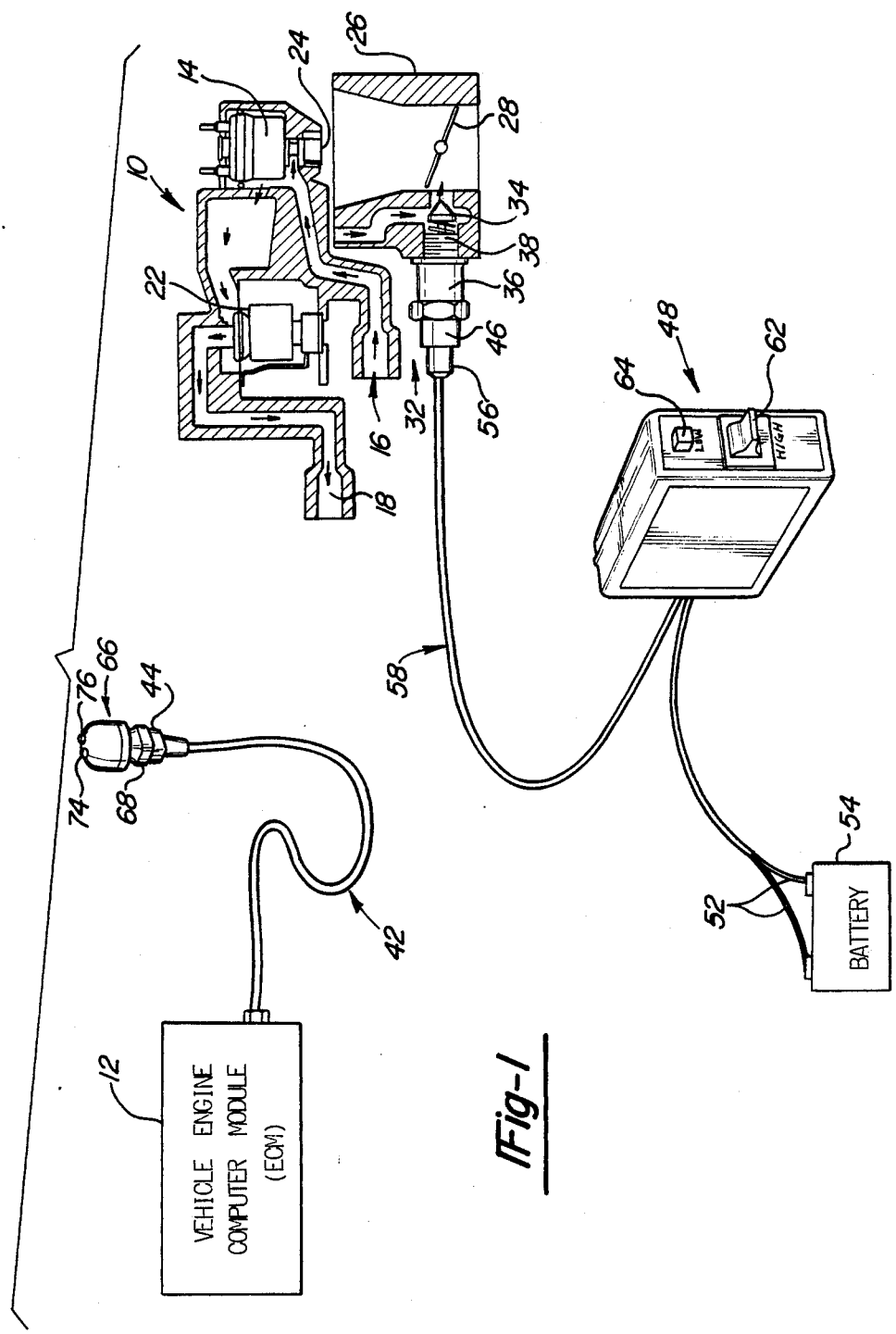
FIG. 1 shows the combined tester and monitor of this invention installed on a vehicle engine.

Referring now to the drawings, there is shown an illustrative embodiment of the invention in a combined stepper motor tester and pulse train monitor for use with a vehicle engine idle air control system. It will be apparent as the description proceeds that the invention may be realized in different embodiments and is useful for other applications.

FIG. 1 illustrates diagrammatically the connection of the combined motor tester and monitor of this invention to a conventional vehicle engine with an idle air control system. The vehicle engine is represented in FIG. 1 by the charge forming system 10 with throttle body fuel injection and the vehicle engine computer module (ECM) 12.

The charge forming system comprises, in general, a fuel injector 14 which is connected with a fuel inlet conduit 16 from a fuel pump (not shown) and a fuel return conduit 18 through a fuel pressure regulator 22. Fuel is injected through the nozzle 24 of the fuel injector 14 into the throttle body venturi 26 which contains the throttle valve 28. Air supply for engine idle operation is provided through an idle air inlet passage 32 through an idle air control valve or pintle 34 to the downstream side of the throttle valve 28. The pintle 34 is actuated by a stepper motor 36 which is a reversible rotary motor of conventional construction. The pintle 34 is connected with the rotary stepper motor 36 through a linear actuator 38 and is extended or retracted in accordance with the direction of rotation of the motor. The stepper motor 36 is controlled by the ECM which develops a control signal in accordance with engine parameters. The control signal of the ECM is applied to a driver circuit, an integral part of the ECM, which produces first and second pulse trains for energization of the stepper motor 36. In normal engine operation, the pulse trains are applied through a vehicle wiring harness 42 to the motor 36. The harness includes a disconnectible connector 44 which mates with a motor connector 46 on the stepper motor 36.

When the stepper motor 36 is to be tested, the connector 44 is disconnected from the connector 46 and the motor tester 48 is hooked up, as shown in FIG. 1, by connecting its supply voltage conductors 52 to the battery 54 and by connecting the connector 56 of wiring harness 58 to the motor connector 46. The motor tester 48 is a hand held unit with a manually actuable paddle switch 62 and an indicator LED 64 which lights to indicate proper connection. The circuit of the motor tester 48 will be described subsequently.

For the purpose of monitoring the pulse trains generated by the driver circuit of the ECM 12, the connector 44 of the ECM wiring harness 42 is plugged into a monitor 66. The monitor 66 comprises a connector 68 which mates with the connector 44. It also comprises a dome-shaped body supported on connector 68 and upon which is mounted a pair of bi-polar LEDs 74 and 76. The circuit of the monitor 66 will be described subsequently.

The control of the stepper motor 36 by the ECM 12 will be described with reference to FIGS. 2 and 3. Since this is well-known to those skilled in the art, a general description will suffice for present purposes. The stepper motor 36 is provided with a pair of energizing coils 1 and 2 which are adapted to be energized, respectively, by first and second out-of-phase pulse trains. The direction of rotation of the motor is determined by the phase sequence of the pulse trains. The first pulse train for coil 1 is generated by a driver circuit 82 and the second pulse train for coil 2 is generated by a driver circuit 84. The driver circuits 82 and 84 are part of the ECM 12 and the switching of the driver circuits is controlled by a control signal developed by the ECM. As shown in the motor actuation table of FIG. 3, the driver circuits 82 and 84 are switched in synchronism by the ECM 12. As shown in the table, there is a four step sequence, i.e. four different states of each of the driver circuits 82 and 84. The first and second pulse trains 86 and 88, respectively, generated by the driver circuits 82 and 84 are shown in FIG. 4. The first pulse train 86 which is the output of driver circuit 82 is applied through terminals A and B of connector 44 to corresponding terminals A and B of connector 46 which are connected to the respective terminals of coil 1. Similarly, the output pulse train 88 of driver circuit 84 is applied across coil 2 through the terminals C and D of connector 44 and corresponding terminals C and D of connector 46. The numbered, four step sequence in the waveform diagram of FIG. 4 corresponds to the numbers of the four step sequence in the table of FIG. 3. As indicated, the direction of movement of the motor from a quiescent state at any one of the four steps is in one direction if the next step is a higher numbered step and is in the other direction if it is a lower numbered step. The motor moves one increment of motion for each step and each step corresponds to the one-fourth of a cycle of the pulse train. The number of steps of motor movement is determined by the duration of energization which is controlled by the control signal of the ECM.

Figure 5:
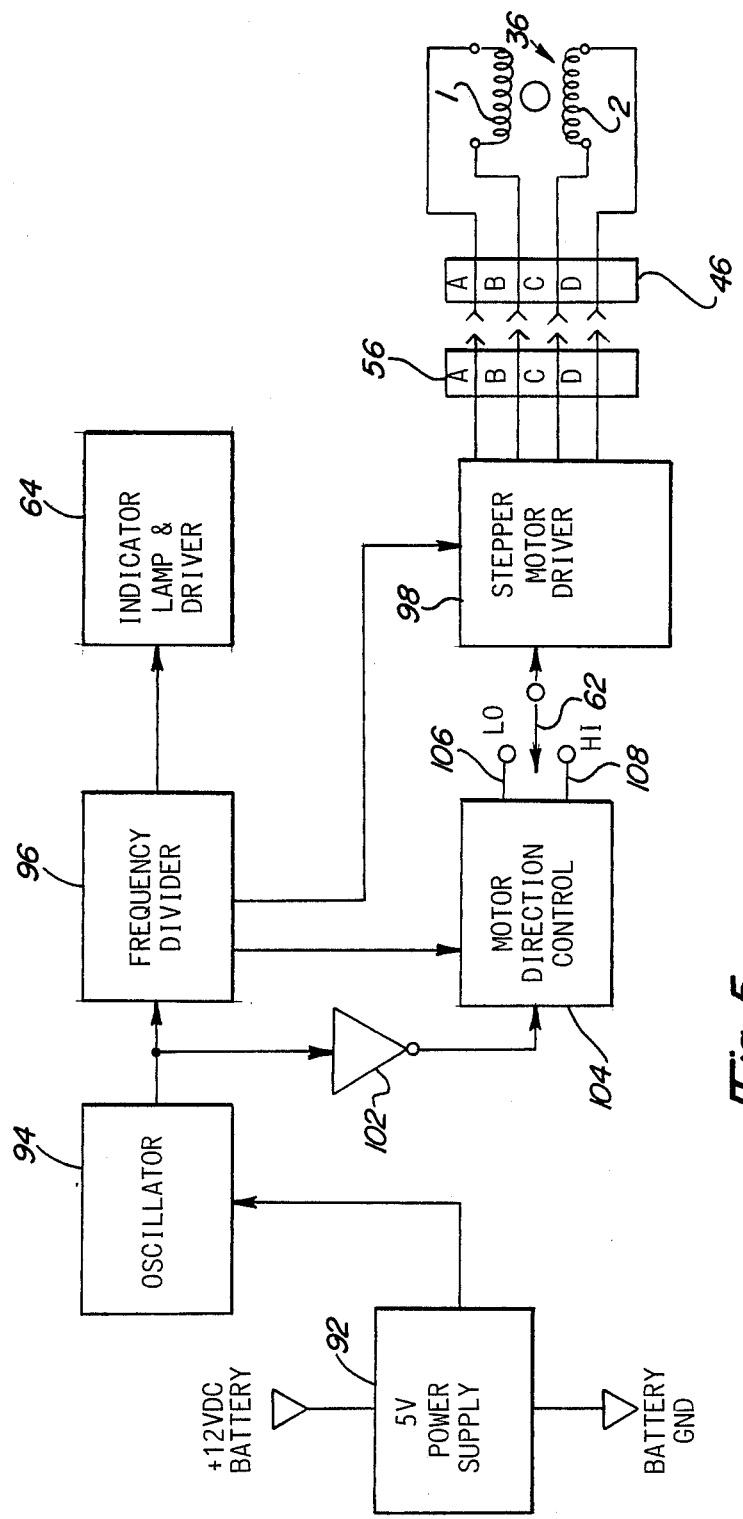
FIG. 5 is a block diagram of the stepper motor tester.

The circuit of the motor tester 48 is shown in FIG. 5. The tester is provided with a five volt power supply 92 which is energized from the vehicle battery. Regulated voltage from the power supply is used to supply the various stages of the electronic circuits of the tester. The tester circuit comprises a fixed frequency oscillator 94 the output of which is applied through a frequency divider 96 to a stepper motor driver circuit 98. The frequency divider output is applied to the circuit of indicator lamp 64. The output of the oscillator 94 is also applied through an inverter 102 to an input of a motor direction control circuit 104. The output of the frequency divider 96 is also applied to another input of the direction control circuit 104. The direction control circuit 104 develops a "low" control signal (for forward direction) on an output 106 and a "high" control signal (for reverse direction) on output 108. The manually actuated switch 62 has a fixed contact connected with output 106 and a fixed contact connected with output 108. The movable contact of the switch 62 is connected with an input of the driver circuit 98. The driver circuit 98 produces a third pulse train between the terminals A and B of the connector 56 which is identical to the first pulse train 86 of FIG. 4. The driver circuit 98 also produces a fourth pulse train between the terminals C and D of connector 56 which is identical to the second pulse train 88 of FIG. 4. When the connector 56 is plugged into the motor connector 46, the third pulse train is applied across coil 1 and the fourth pulse train is applied across coil 2. Thus, with the motor tester connected as shown in FIG. 1, the motor will be energized to move the idle air control valve to decrease the engine idle speed with the switch 62 in the "low" position; it will be energized to move the idle air control valve in the direction to increase the idle speed when the switch is in the "high" position.

Figure 6:
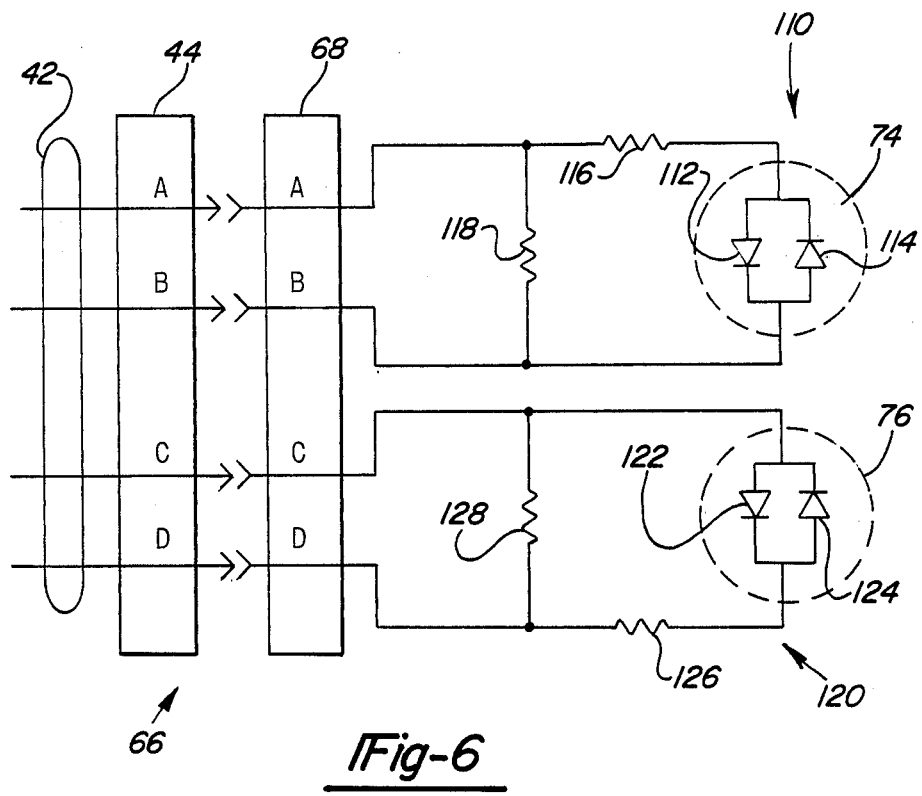
FIG. 6 is a schematic diagram of the monitor circuit.

The circuit of the monitor 66 is shown schematically in FIG. 6. The monitor 66 is adapted to receive the first and second pulse trains 86 and 88 from the ECM and to indicate whether there is any interruption in either pulse train. For this purpose, the connector 44 from the ECM 12 is plugged into the connector 68 on the monitor 66. A first monitor circuit 110 is connected across the terminals A and B of connector 68. It comprises a pair of unidirectionally conductive visual indicator devices in the form of bi-polar LEDs 74 including a red LED 112 and a green LED 114 connected in parallel with each other in opposite polarity. A current limiting resistor 116 is connected in series with the bi-polar LEDs and an impedance matching resistor 118 for matching the source impedance is connected in parallel with the bi-polar LEDs. A second monitor circuit 120 is connected across the terminals C and D of the connector 68. It comprises a pair of unidirectionally conductive visual indicator devices in the form of bi-polar LEDs 76 including a red LED 122 and a green LED 124 connected in parallel with each other in opposite polarity. A current limiting resistor 126 is connected in series with the bi-polar LEDs 76 and an impedance matching resistor 128 is connected in parallel with the bi-polar LEDs. Thus, the first monitor circuit 110 is energized by the first pulse train 86 and the second monitor 120 is energized by the pulse train 88. Throughout the duration of pulse train 86, the red LED 112 and the green LED 114 will flash alternately without both being off at the same time provided that the pulse train is continuous and uninterrupted. Throughout the duration of pulse train 88, the red LED 122 and the green LED 124 will flash alternately without both being off at the same time provided that the pulse train is continuous and uninterrupted. If in either of the monitor circuits 110 or 120 an LED does not blink or blinks only one color a fault in the idle air control system is indicated. Such a fault may be faulty connector terminal contacts, open circuit, short circuit or a faulty ECM connection.

It will be appreciated that operation of the motor tester 48 under manual control will cause the third and fourth pulse trains to be applied to the coils and 2 of the stepper motor for a duration corresponding to the switching by manually actuated switch 62 and in a direction corresponding to the direction of switch movement. With the vehicle engine running, the ECM will respond to the changing engine conditions caused by operation of the stepper motor and will produce first and second pulse trains 86 and 88 in response to the changing conditions. Thus, the monitor circuit 110 and 120 will respond by flashing of the red and green LEDs of the respective circuits.

Although the description of this invention has been given with reference to a particular embodiment, it is not to be construed in a limiting sense. Many variations and modifications will now occur to those skilled in the art. For a definition of the invention reference is made to the appended claims.

What is claimed is:

1. In a tester for a vehicle engine idle air control system which includes an idle air intake valve, a stepper motor for actuating said valve, a vehicle engine computer for producing an idle air control signal in response to engine parameters and a driver circuit for producing first and second out-of-phase, sequence-controlled pulse trains for energization of first and second coils, respectively, of said motor for direction and displacement control thereof in response to said control signal, said driver circuit being coupled to said motor through a first wiring harness including a first disconnectible connector having first and second pairs of terminals connected to said motor, said first and second pulse trains being applied across said first and second pairs of terminals, respectively, whereby said motor is controlled by said computer, said tester including a motor tester of the type comprising a driver pulse generator for generating third and fourth out-of-phase pulse trains and manually actuated switch means for controlling the phase-sequence and time duration of said third and fourth out-of-phase pulse trains, a second wiring harness including a second disconnectible connector having third and fourth pairs of terminals adapted to be connected to said motor when said first disconnectible connector is disconnected, said third and fourth pulse trains being applied across said third and fourth pairs of terminals, respectively, for control of the direction and displacement of said motor by actuation of said switch means whereby the operating condition of said engine is changed and said computer responds thereto and causes said driver circuit to produce said first and second pulse trains across said first and second pairs of terminals, respectively, according to the actuation of said switch means, the improvement comprising a pulse train monitor including:

a third connector having fifth and sixth pairs of terminals, a first circuit with a first pair of unidirectionally conductive visual indicator devices connected in parallel with opposite polarity between said fifth pair of terminals of said third connector, a second circuit with a second pair of unidirectionally conductive visual indicator devices connected in parallel with opposite polarity between said sixth pair of terminals of said third connector, said third connector being adapted to mate with said first connector when it is disconnected from said motor with said first and second pairs of terminals being connected respectively with said fifth and sixth pairs of terminals, whereby said first and second pulse trains produced in response to actuation of said switch means cause each pair of indicator devices to alternately flash without both devices of a pair being off at the same time in response to satisfactory pulse trains.

2. The tester as defined in claim 1 wherein each of said visual indicator devices comprises and LED.

3. The tester as defined in claim 2 wherein said first pair of LEDs comprises a bi-polar LED of two different colors and said second pair of LEDs comprises a bi-polar LED of two different colors.

4. The tester as defined in claim 3 including:

a separate current limiting resistor connected in series with each of said pairs of bi-polar LEDs, and a separate impedance matching resistor connected in parallel with each of said pairs of bi-polar LEDs.

5. In combination, a source of pulses for energizing a stepper motor, said source comprising first and second pairs of output terminals adapted to supply first and second out-of-phase voltage pulse trains for energizing first and second motor coils, respectively, with alternating polarity, a first circuit having first and second input terminals connected respectively with said first pair of output terminals and having a first pair of unidirectionally conductive indicator devices connected in parallel with opposite polarity between said first and second input terminals, and a second circuit having third and fourth input terminals connected respectively with said second pair of output terminals and having a second pair of unidirectionally conductive indicator devices connected in parallel with opposite polarity between said third and fourth input terminals, whereby each pair of said devices will be alternately on and off without both of said devices of either pair being off at the same time in response to an uninterrupted pulse train.

6. The combination as defined in claim 5 wherein each of said indicator devices is a LED.

7. The combination as defined in claim 6 wherein said first pair of LEDs comprises a bi-polar LED of two different colors and said second pair of LEDs comprises a bi-polar LED of two different colors.

* * * * *